US006951000B2

(12) United States Patent
Cowan et al.

(10) Patent No.: US 6,951,000 B2
(45) Date of Patent: Sep. 27, 2005

(54) SIMULATED VOLTAGE CONTRASTED IMAGE GENERATOR AND COMPARATOR

(75) Inventors: Joseph Cowan, West Linn, OR (US); Tracy Myers, Clackamas, OR (US)

(73) Assignee: LSI Logic Corporation, Milpitas, CA (US)

( * ) Notice: Subject to any disclaimer, the term of this patent is extended or adjusted under 35 U.S.C. 154(b) by 423 days.

(21) Appl. No.: 10/349,770

(22) Filed: Jan. 22, 2003

(65) Prior Publication Data

US 2004/0143803 A1 Jul. 22, 2004

(51) Int. Cl.[7] .............................................. G06F 17/50
(52) U.S. Cl. ................................................ 716/4; 716/5
(58) Field of Search ........................ 716/4–5; 703/13; 438/14, 16–18; 324/500–501, 765; 714/721

(56) References Cited

U.S. PATENT DOCUMENTS 5,581,742 A * 12/1996 Lin et al. ........................ 716/4

6,487,701 B1 * 11/2002 Dean et al. ..................... 716/4

* cited by examiner

Primary Examiner—Stacy A. Whitmore
Assistant Examiner—Paul Dinh
(74) Attorney, Agent, or Firm—Fitch, Even, Tabin & Flannery

(57) ABSTRACT

A method of generating a simulated voltage contrast image includes steps for receiving as input design information for an integrated circuit die, selecting a net of the integrated circuit from the design information, generating a trace outline of the selected net from the image, analyzing the design information to calculate an interaction between a charged particle beam and the selected net, selecting a shading representative of the calculated interaction, and filling the trace outline of the selected net with the shading to generate the simulated voltage contrast image.

21 Claims, 8 Drawing Sheets

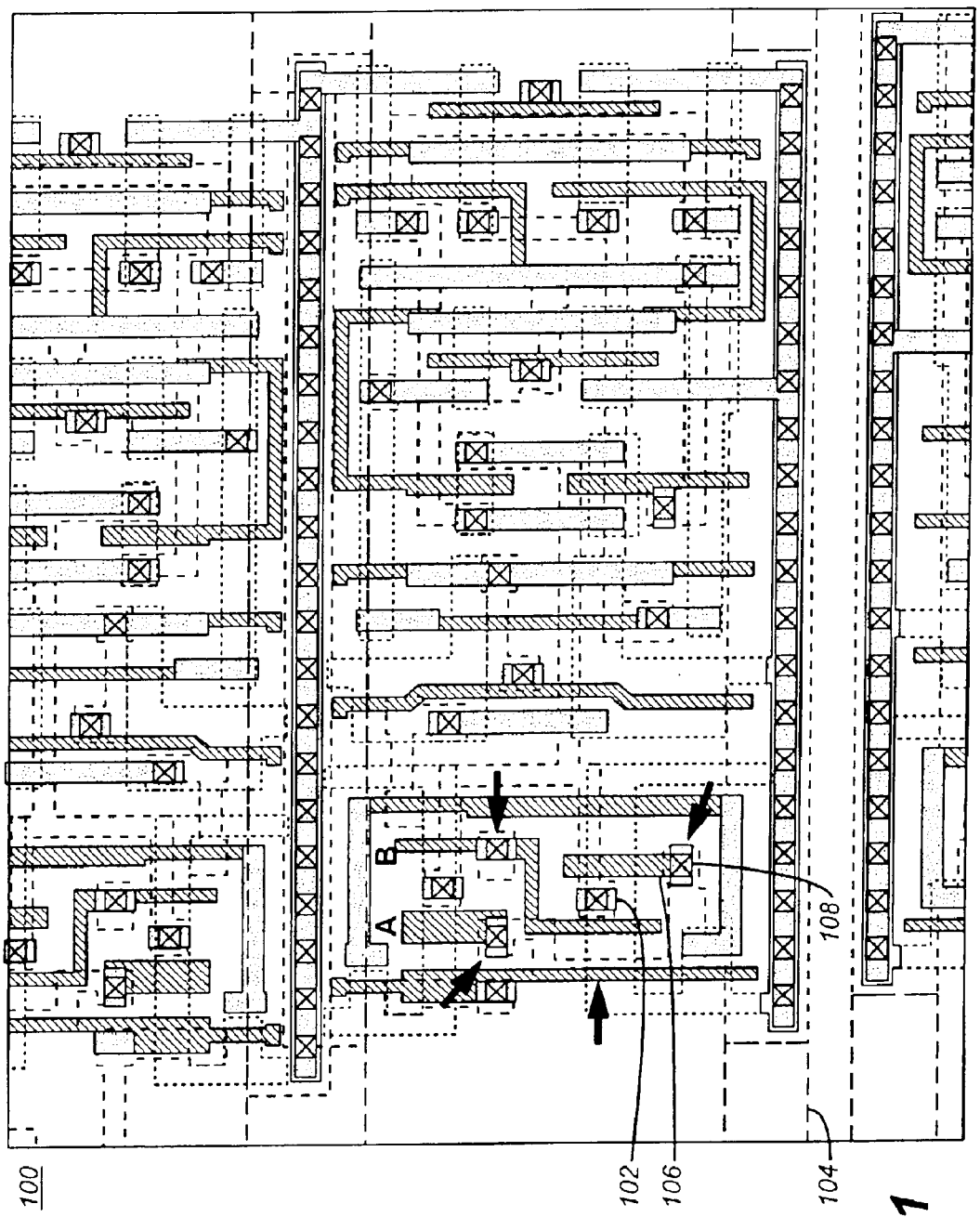
FIG._1

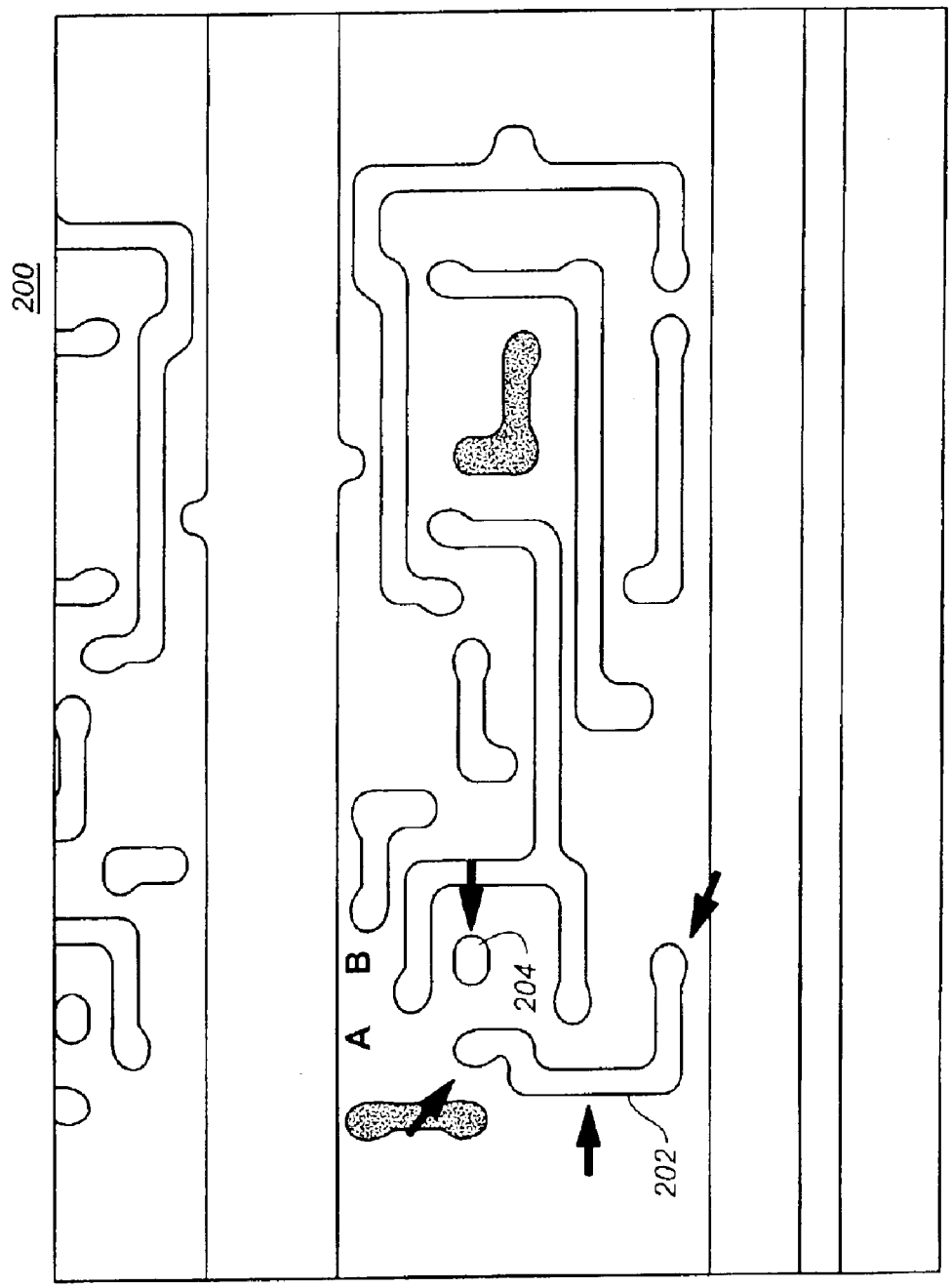
FIG._2 (PRIOR ART)

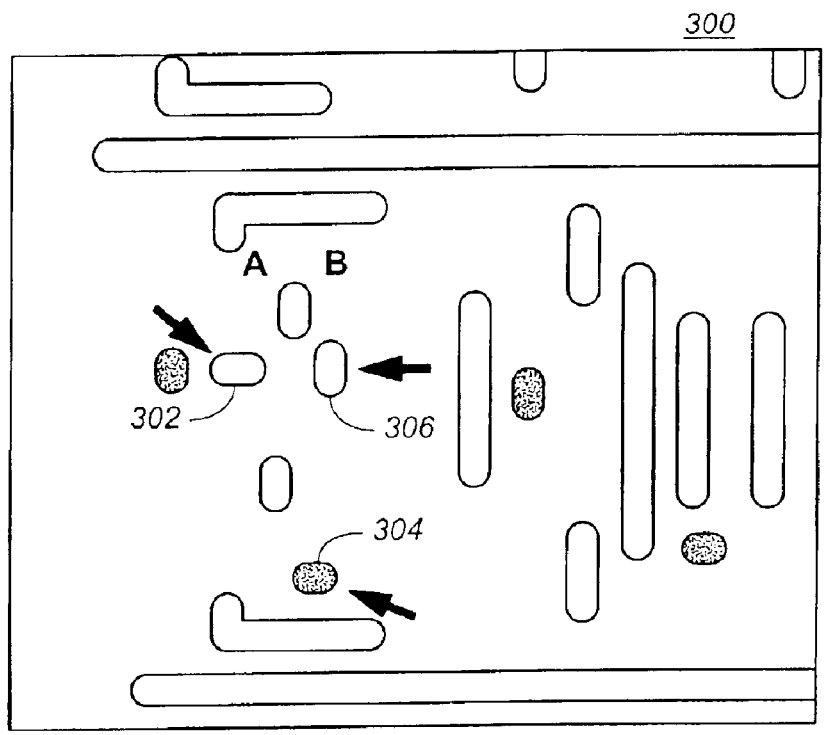
FIG._3 (PRIOR ART)
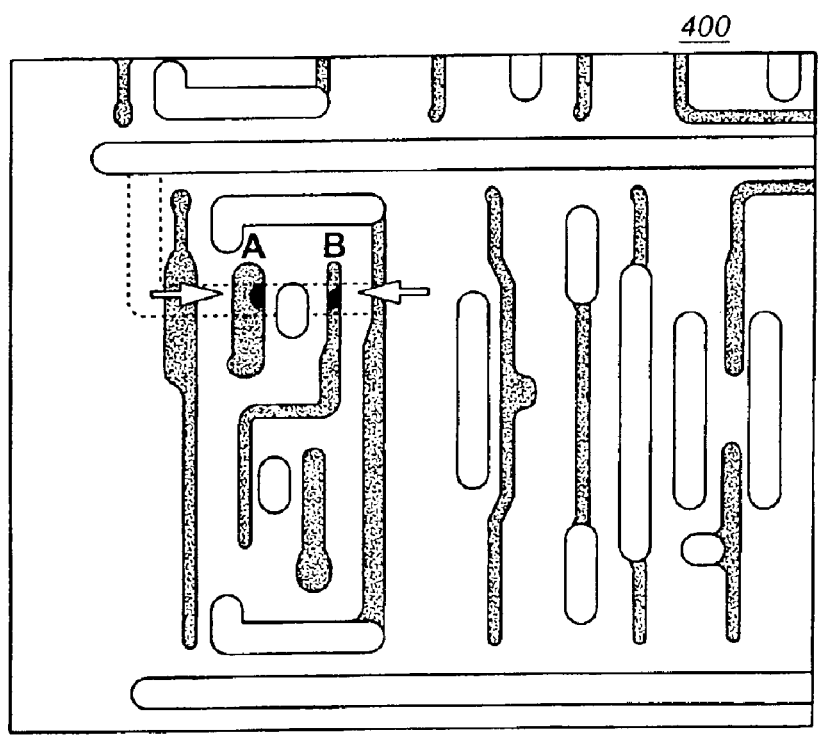
FIG._4 (PRIOR ART)

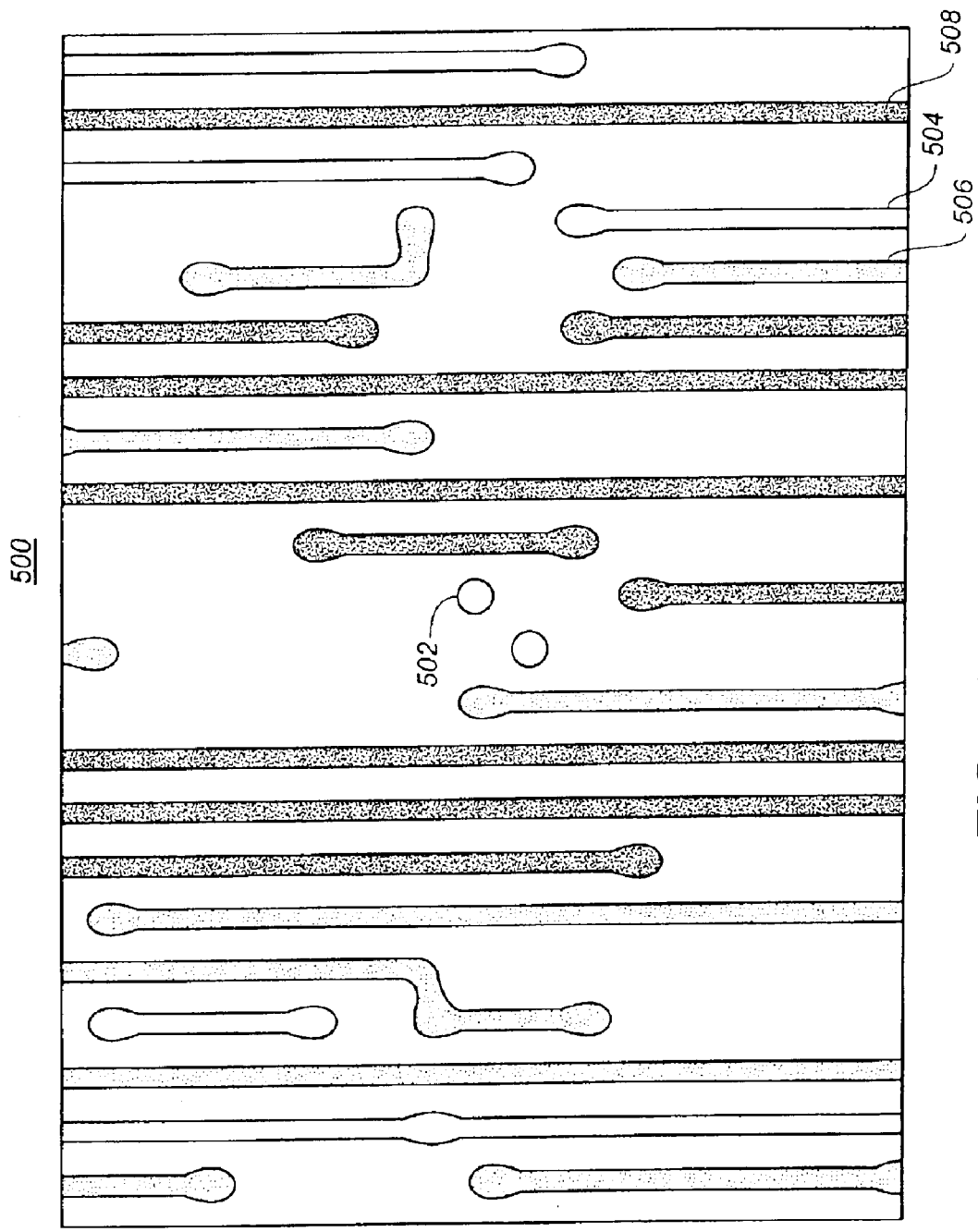
FIG._5 (PRIOR ART)

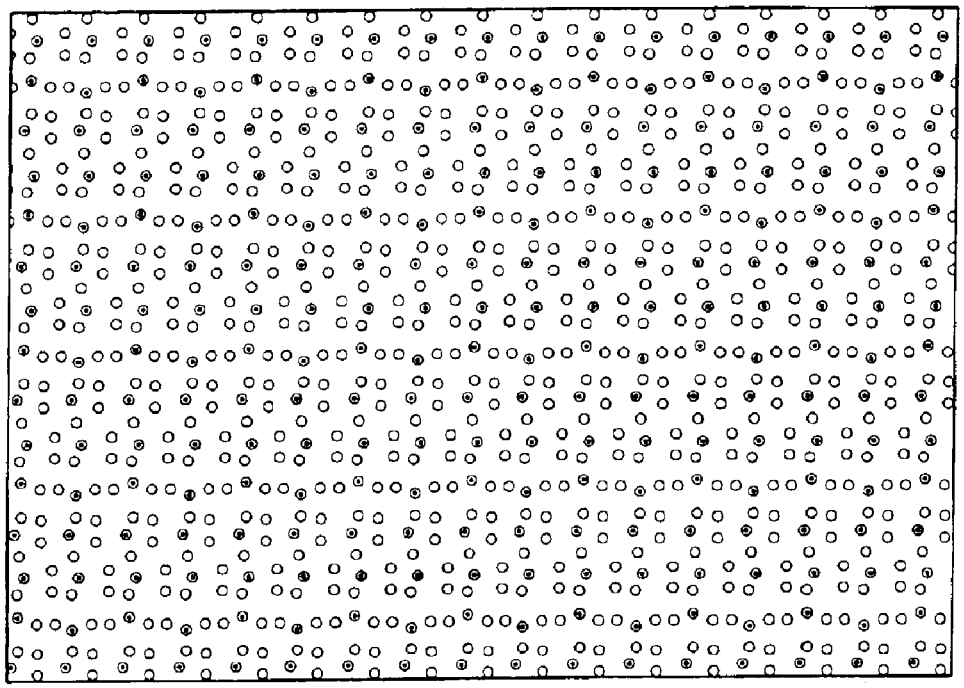
FIG._6 (PRIOR ART)
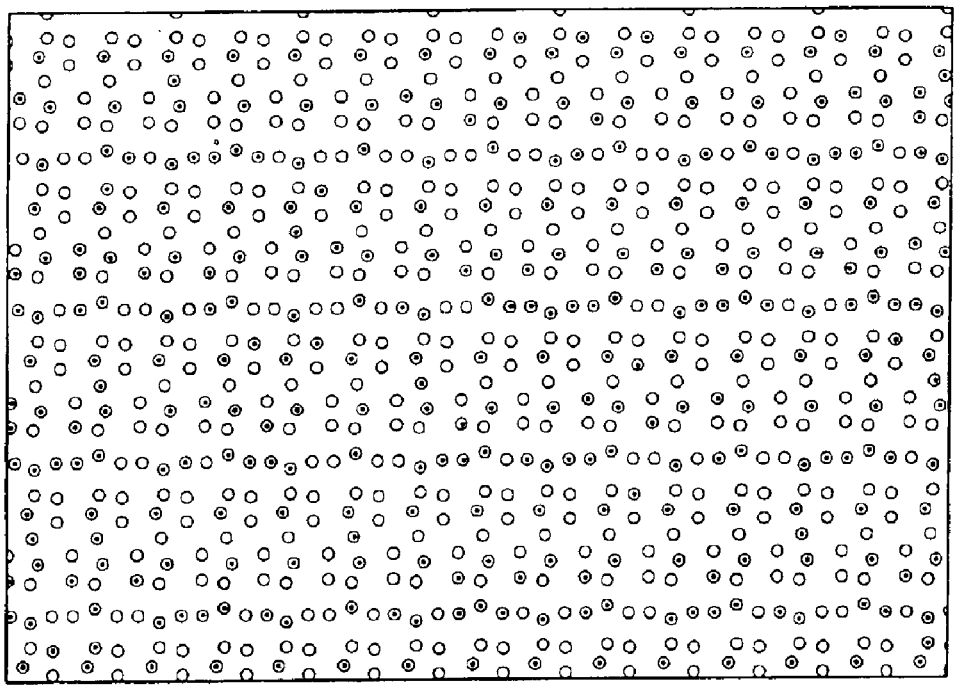
FIG._7 (PRIOR ART)

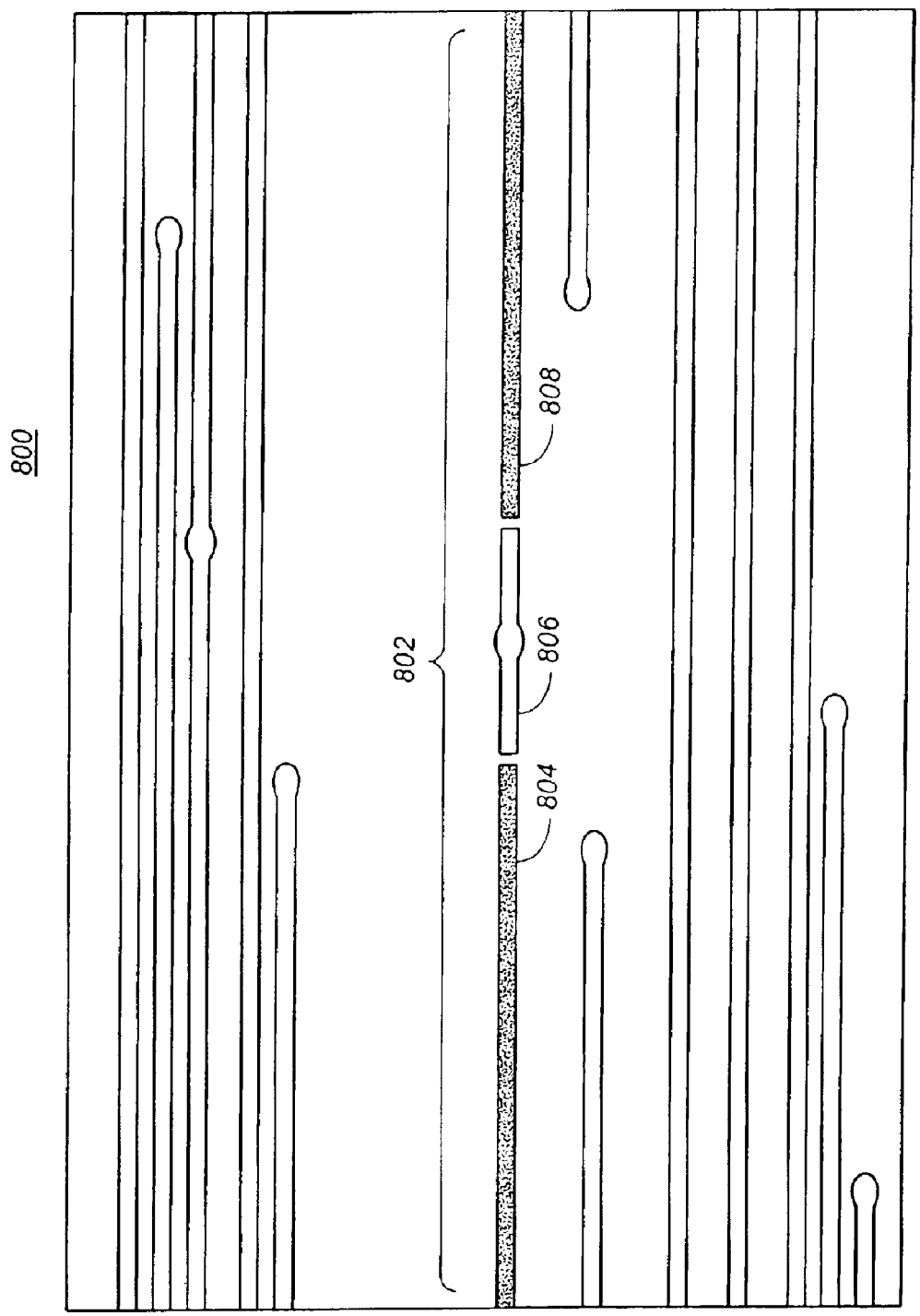
FIG._8

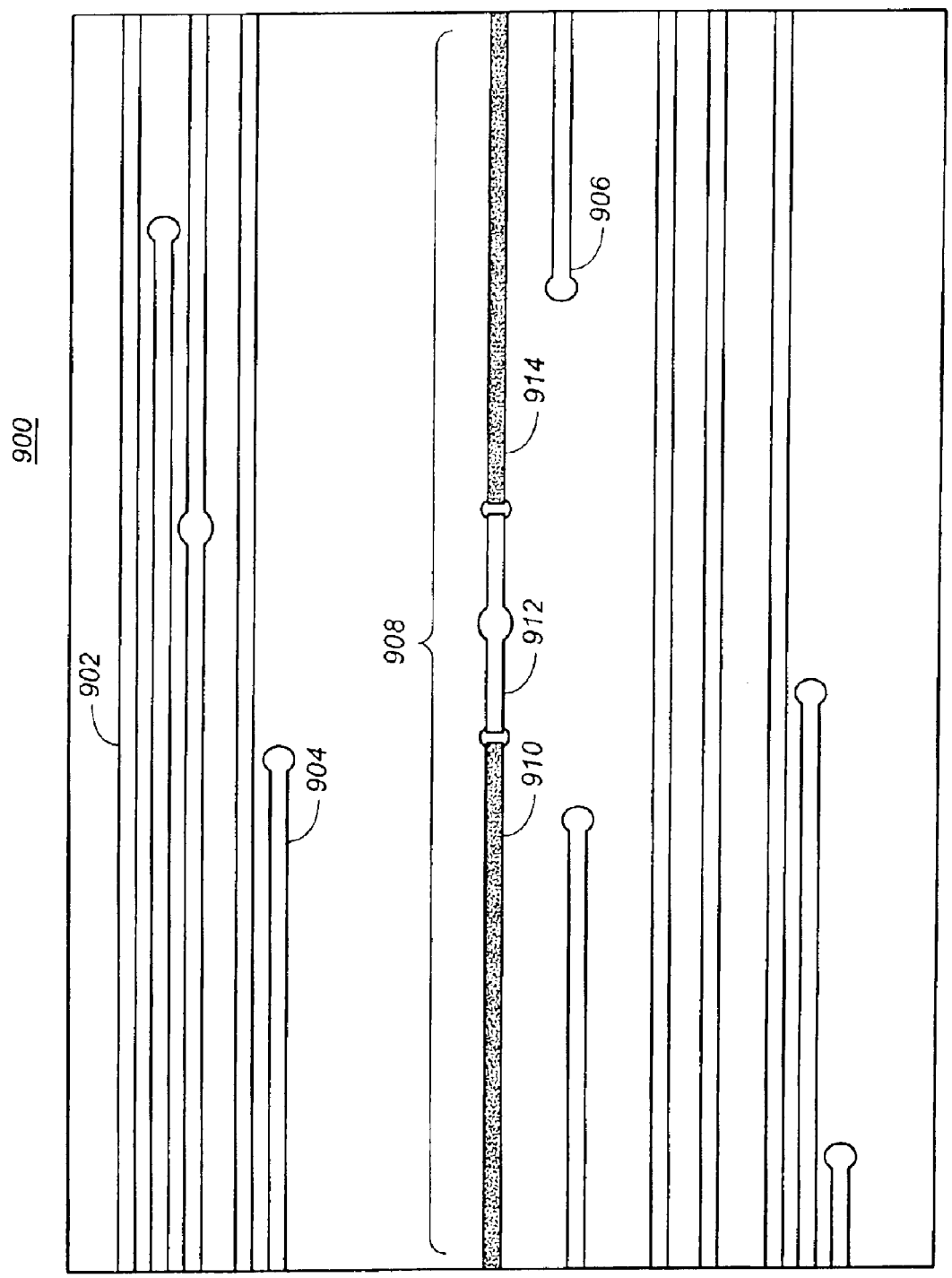
FIG._9

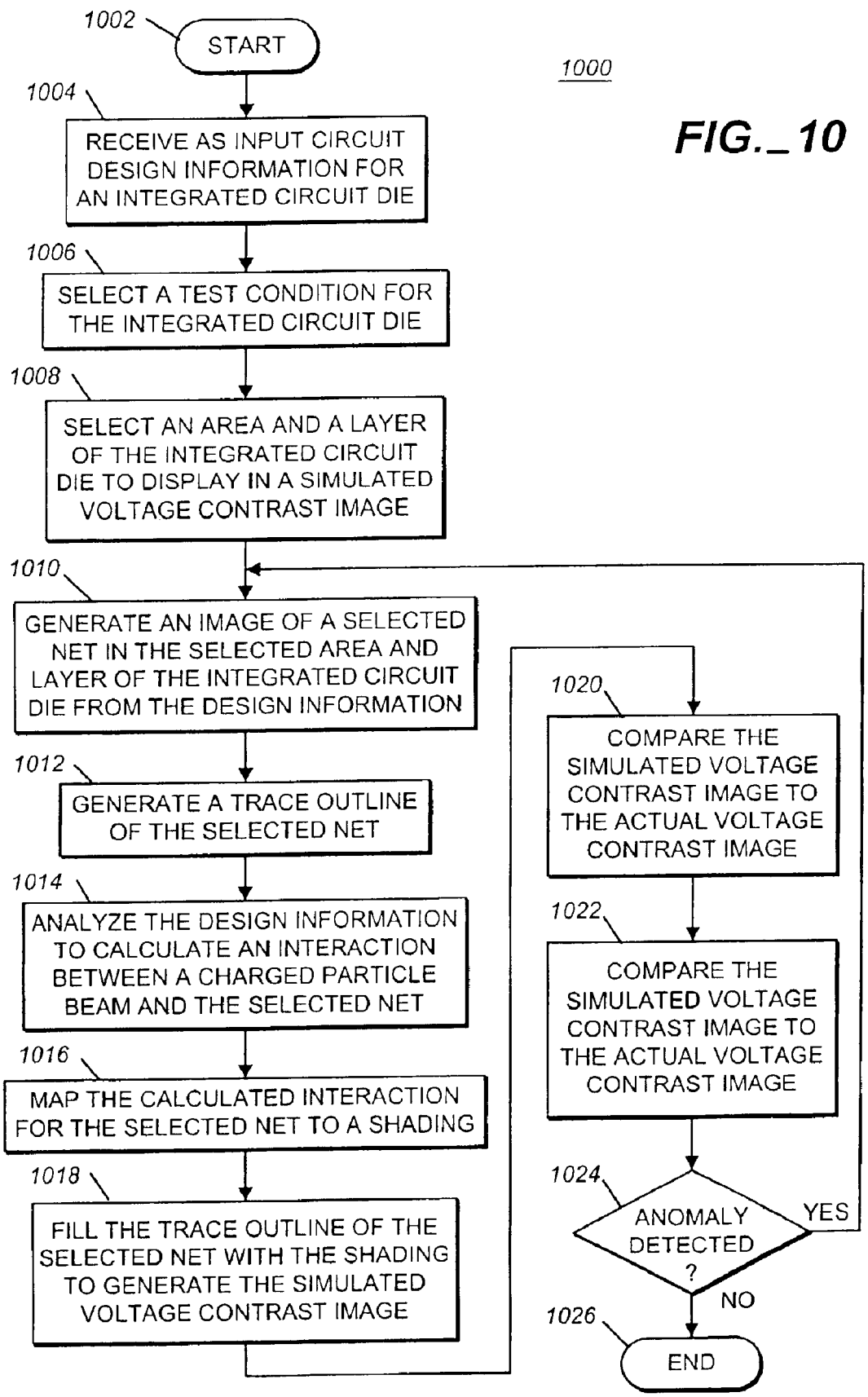
FIG._10

DESCRIPTION OF THE ILLUSTRATED EMBODIMENTS
SIMULATED VOLTAGE CONTRASTED IMAGE GENERATOR AND COMPARATOR

BACKGROUND OF THE INVENTION

1. Field of the Invention

The present invention is directed to methods for inspecting voltage contrast images of integrated circuit dies. More specifically, but without limitation thereto, the present invention is directed to generating simulated voltage contrast images that may be compared to actual voltage contrast images to detect the location and type of defect in an integrated circuit die for a selected test condition.

2. Description of the Prior Art

Voltage contrast imaging is typically performed by directing a beam of charged particles such as ions or electrons onto the surface of an integrated circuit die under test and measuring the number of ions or electrons that are scattered from a net in a selected area in a selected metal layer of the die. If the net has a DC electrical path to the circuit ground, that is, the die substrate, then more ions or electrons are scattered from the net than if the net does not have a DC electrical path to the die substrate. The number of charged particles received by a detector from each pixel of the selected area may be displayed as a brightness level in an image, called a voltage contrast image, that shows in real time whether each net has a DC electrical path to the die substrate. The voltage contrast image may be generated without disturbing the operation of the circuit and without exposing the die to possible damage from mechanical probes.

SUMMARY OF THE INVENTION

In one aspect of the present invention, a method of generating a simulated voltage contrast image includes steps for receiving as input design information for an integrated circuit die, selecting a net of the integrated circuit from the design information, generating a trace outline of the selected net from the image, analyzing the design information to calculate an interaction between a charged particle beam and the selected net, selecting a shading representative of the calculated interaction, and filling the trace outline of the selected net with the shading to generate the simulated voltage contrast image.

In another aspect of the present invention, a method of generating a simulated voltage contrast image includes steps for receiving as input design information for an integrated circuit die, selecting a test condition for the integrated circuit die, selecting an area and a layer of the integrated circuit die to display in a simulated voltage contrast image, generating an image of a selected net in the selected area and layer of the integrated circuit die from the design information, generating a trace outline of the selected net from the image, analyzing the design information to calculate an interaction between a charged particle beam and the selected net for the selected test condition, mapping the calculated interaction for the selected net to a shading, and filling the trace outline of the selected net with the shading to generate a simulated voltage contrast image for the selected test condition.

In a further aspect of the present invention, the methods illustrated in the flowchart descriptions above may be embodied in a computer program product and implemented by instructions for a computer according to well known programming techniques to perform the following functions:

(a) receiving as input design information for an integrated circuit die;
(b) selecting a net of the integrated circuit from the design information;
(c) generating a trace outline of the selected net from the image;
(d) analyzing the design information to calculate an interaction between a charged particle beam and the selected net;
(e) selecting a shading representative of the calculated interaction; and
(f) filling the trace outline of the selected net with the shading to generate the simulated voltage contrast image.

DESCRIPTION OF THE DRAWINGS

The present invention is illustrated by way of example and not limitation in the accompanying figures, in which like references indicate similar elements throughout the several views of the drawings, and in which:

FIG. 1 illustrates an example of an image of a design layout of an integrated circuit die that may be used to generate a voltage contrast image according to an embodiment of the present invention;

FIG. 2 illustrates an actual voltage contrast image of the prior art for the metal 1 layer in a selected portion of the integrated circuit die for the design layout of FIG. 1;

FIG. 3 illustrates an actual voltage contrast image of the prior art for the local interconnect layer in the selected portion of the integrated circuit die for the design layout of FIG. 1;

FIG. 4 illustrates an electron microscope image of the prior art for the gate oxide layer in the selected portion of the integrated circuit die for the design layout of FIG. 1;

FIG. 5 illustrates an actual voltage contrast image of the prior art for a metal 2 layer of an integrated circuit die that may be analyzed by a simulated voltage contrast image according to an embodiment of the present invention;

FIG. 6 illustrates an actual voltage contrast image of the prior art for a contact layer of a defect-free integrated circuit die that may be generated as a simulated voltage contrast image according to an embodiment of the present invention;

FIG. 7 illustrates an actual voltage contrast image of the prior art for the contact layer of a defective integrated circuit die having the same design as the integrated circuit die of FIG. 6;

FIG. 8 illustrates an actual voltage contrast image of a metal layer of an integrated circuit die that may be generated as a simulated voltage contrast image according to an embodiment of the present invention;

FIG. 9 illustrates a simulated voltage contrast image corresponding to the actual voltage contrast image of FIG. 8; and FIG. 10 illustrates a flow chart of a method of generating a simulated voltage contrast image for an integrated circuit according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

Manually inspecting voltage contrast images is time consuming, tedious, and error prone. Adjustments to the ion beam or electron beam equipment used to perform voltage contrast analysis result in changes in the contrast of the displayed features of the sample die that may affect the interpretation of the voltage contrast image. In voltage contrast analysis systems of the prior art, a good sample is interchanged with a defective sample in the ion beam or electron beam equipment and their respective voltage contrast images are compared. While avoiding some of the tedious and error prone aspects of the manual approach, this technique is time consuming and requires expensive analyzing equipment. Moreover, the image of a defective sample is only compared to what is expected of a good sample and not to what is expected by the design.

In one aspect of the present invention, a method of generating a simulated voltage contrast image includes steps for receiving as input design information for an integrated circuit die, selecting a net of the integrated circuit from the design information, generating a trace outline of the selected net from the image, analyzing the design information to calculate an interaction between a charged particle beam and the selected net, selecting a shading representative of the calculated interaction, and filling the trace outline of the selected net with the shading to generate the simulated voltage contrast image.

FIG. 1 illustrates an example of an image 100 of a design layout of an integrated circuit die that may be used to generate a simulated voltage contrast image according to an embodiment of the present invention. Shown in FIG. 1 are local interconnects 102, metal 1 layer conductors 104, polysilicon layer structures 106, contacts 108, and logic gates A and B.

The local interconnects 102 connect portions of the polysilicon layer structures 106 to one another. The polysilicon layer structures 106 may include, for example, transistors used to form the logic gates "A" and "B". The contacts 108 are vias that connect the local interconnects 102 to the metal 1 layer conductors 104. The arrows point to areas of interest corresponding to the selected portion of the integrated circuit die around the logic gates marked "A" and "B" in FIGS. 1, 2, 3 and 4.

The image 100 may be generated from the design layout of an integrated circuit die according to well known techniques by computer automated drafting (CAD) software readily available from, for example, Mentor Graphics, Knights and Voloview.

FIG. 2 illustrates an actual voltage contrast image 200 of the prior art for the metal 1 layer in the selected portion of the integrated circuit die for the design layout of FIG. 1. Shown in FIG. 2 are metal 1 layer conductors 202 and 204 connecting the logic gates marked "A" and "B".

The voltage contrast image of FIG. 2 may be generated, for example, by a scanning electron microscope such as the Hitachi model S-4700. The arrows point to the two local interconnects 202 and 204 that respectively constitute two nets of interest. The two metal 1 layer conductors 202 and 204 are bright, indicating that the two nets have DC paths to circuit ground.

In typical manual methods of analyzing a voltage contrast image in the prior art, the CAD image 100 in FIG. 1 is referenced to trace the two nets to their respective ends. In this example, the two nets from the metal 1 layer down are connected only to the logic gates "A" and "B", which should be electrically isolated from circuit ground. If the nets were actually isolated from circuit ground, they would appear with dark shading in the voltage contrast image. The bright shading indicates that the two nets are not isolated from circuit ground as expected, but have DC paths to circuit ground. To investigate this anomaly, the two nets are broken by removing portions of the two metal 1 layer conductors 202 and 204 according to well known techniques, such as cutting by a focused ion beam. Each subsequent layer of the die is then inspected by voltage contrast imaging until the cause of the anomaly is discovered.

FIG. 3 illustrates an actual voltage contrast image 300 of the prior art for the local interconnect layer in the selected portion of the integrated circuit die for the design layout of FIG. 1. Shown in FIG. 3 are local interconnects 302, 304, and 306 and logic gates A and B.

After removing the portions of the metal 1 layer conductors as described above, the two local interconnects 302 and 304 are no longer connected. Each of the three local interconnects 302, 304, and 306 is now connected only to one logic gate, and all three local interconnects 302, 304, and 306 should appear in dark shading in the voltage contrast image. In this example, however, only the local interconnect 304 appears dark. This indicates that the logic gates A and B are probably damaged. Portions of the polysilicon layer are then removed around the logic logic gates A and B according to well known techniques to expose the gate oxide layer below the polysilicon layer.

FIG. 4 illustrates an electron microscope image 400 of the prior art for the gate oxide layer in the selected portion of the integrated circuit die for the design layout of FIG. 1. The dark areas indicated by the arrows are gate ruptures or holes in logic gates A and B. The holes in the gate oxide layer indicate that an inadvertent connection was made from the gate to the substrate, possibly from electrical overstress.

Voltage contrast imaging may also be used to analyze a wide variety of other problems in various layers of an integrated circuit die in addition to finding portions of a metal layer that are shorted to ground.

FIG. 5 illustrates a voltage contrast image 500 of the prior art for a metal 2 layer of an integrated circuit die that may be analyzed by a simulated voltage contrast image according to an embodiment of the present invention. Shown in FIG. 5 are an M2 (metal layer 2) post 502 and M2 conductors 504, 506 and 508.

The M2 post 502 appears with bright shading in the voltage contrast image 500, indicating that the M2 post 502 has a DC path to circuit ground, however a circuit analysis indicates that the M2 post 502 should be isolated. The different voltages of the M2 conductors 504, 506 and 508 illustrate the different shading levels that may appear in the voltage contrast image 500.

Analyzing voltage contrast images at each layer of an integrated circuit die requires knowing the correct DC path of each net for the selected test conditions. As more metal layers are included in the analysis, tracing the correct DC path of each net from the design layout becomes increasingly complex.

In another example of manual voltage contrast image analysis, a layer of interest is isolated in a voltage contrast image of a defect free die and compared to the corresponding voltage contrast image of a defective die.

FIG. 6 illustrates a voltage contrast image 600 of the prior art for a contact layer of a defect free integrated circuit die. In FIG. 6, each contact appears as a light (grounded) or a dark (floating) circle.

FIG. 7 illustrates a voltage contrast image 700 of the prior art for the contact layer of a defective integrated circuit die having the same design as the integrated circuit die of FIG.

6. In FIG. 7, numerous contacts are dark while the corresponding contacts in FIG. 6 are light, indicating that there are open circuits in the die being tested in FIG. 7. This method requires relying on the voltage contrast image of one die as indicative of the correct voltage contrast image for all the other dies.

The visual comparison of the voltage contrast image of each layer of a known defect free die with the corresponding voltage contrast image of other dies of the same design is widely used in the production of integrated circuits. By identifying which nets should appear bright and which nets should appear dark, defects may be detected by a visual comparison for a selected test condition. A disadvantage of relying on the voltage contrast image of one die as indicative of the correct voltage contrast image for all the other dies is the effort involved in making and testing the reference die to ensure that the reference die is defect free.

FIG. 8 illustrates a voltage contrast image 800 of a metal layer of an integrated circuit die that may be generated as a simulated voltage contrast image according to an embodiment of the present invention. Shown in FIG. 8 are a metal layer conductor 802 and three net segments 804, 806 and 808.

The metal layer conductor 802 constitutes a suspected defective net that has been cut by a focused ion beam (FIB) into the three net segments 804, 806 and 808. The net segment 806 appears brighter than the two net segments 804 and 808 in the voltage contrast image 800. After modifying the circuit design by disconnecting the three net segments 804, 806 and 808 in the netlist, the modified circuit design may be analyzed by well known design tools to determine that the bright net segment 806 has a DC electrical path to circuit ground through a transistor source/drain and that the two dark net segments 804 and 808 are connected to logic gates, indicating the net is good.

In one embodiment of the present invention, a CAD image file of the circuit design for the integrated circuit die being tested is generated from the modified circuit design according to well known CAD techniques. The CAD image file is then used to generate an outline of each selected net in the selected area and layer of the integrated circuit die to create a simulated voltage contrast image. The expected voltage contrast image of each net is determined from an analysis of the design layout. For example, the design layout may include a GDS2 file generated according to standard techniques by available integrated circuit design tools. A SPICE netlist of the transistor level design may also be generated according to standard techniques by available integrated circuit design tools to assist in the circuit analysis for each selected test condition. For a test condition in which nets are bridged or cut as in the example of FIG. 8, the corresponding circuit modifications to the net may be entered using the integrated circuit design tools to connect two or more nets (bridging) or to cut a net to isolate various components of the integrated circuit die, for example, gates, source/drain, and power.

Once any desired circuit modifications have been entered in the design layout, a CAD image file of the integrated circuit die design is generated from the design layout according to well known techniques. The portion of the CAD image file that includes the area and layer of interest in the integrated circuit die design may be selected, for example, by zooming and panning a display of the CAD image file. A trace outline of each selected net is then generated from the displayed CAD image as shown in FIG. 9.

FIG. 9 illustrates a simulated voltage contrast image 900 corresponding to the actual voltage contrast image of FIG. 8. Shown in FIG. 9 are nets 902, 904, 906, 908 and net segments 910, 912 and 914.

The simulated voltage contrast image 900 may be traced from the net outlines of the displayed CAD image generated for the integrated circuit die design of FIG. 8. Alternatively, the net outlines may be obtained by extracting the required information from the CAD image file. The shape of the net outlines depends on which layer of the integrated circuit design is selected. In a contact layer, for example, the shape of the traced outlines may include small circles as in the example of FIGS. 6 and 7, while in a metal layer, the traced outlines may include lines that extend outside the field of view, such as in the examples of FIGS. 8 and 9. Some nets may end or begin in the simulated voltage contrast image 900, for example, the nets 904 and 906.

The net 908 has been modified to form the three net segments 910, 912 and 914 in the design layout. The three net segments 910, 912 and 914 correspond to the physical modification made to the die by a focused ion beam for the selected test condition illustrated in the actual voltage contrast image 800 of FIG. 8.

After generating the traced outline of each selected net in the selected area and layer of the integrated circuit design, the circuit design may be analyzed using standard circuit simulation tools to calculate the interaction between a charged particle beam and each of the net segments 910, 912 and 914 for the selected test condition. The calculated interaction of each of the net segments 910, 912 and 914, typically expressed as a number of charged particles scattered from each net and received by a detector, is accordingly mapped to, for example, a gray scale that is matched to the specific voltage contrast imaging contrast equipment being used. For example, the gray scale is dependent on whether a positive ion, negative ion, or electron beam is used and on parameters such as the accelerating voltage settings of the charged particle beam of electrons or ions and the tilt angle of the charged particle beam with respect to the die.

The gray shade corresponding to the calculated interaction of each of the net segments 910, 912 and 914 is then used to fill the traced outline of each of the selected net segments 910, 912 and 914 in the simulated voltage contrast image 900. In alternative embodiments, color may be used instead of gray scale to facilitate visual analysis for various selected test conditions.

The simulated voltage contrast image 900 may readily be compared by visual or automated inspection techniques to the actual voltage contrast image 800 to detect defects or other specific operating characteristics of the integrated circuit die. Advantageously, the generation of a simulated voltage contrast image according to the present invention avoids the necessity of successfully manufacturing and thoroughly testing a defect free die before testing other dies. Also, extraneous information that may appear in an actual voltage contrast image may be omitted from the simulated voltage contrast image to focus attention on the specific nets and features of interest in the integrated circuit design.

In another aspect of the present invention, a method of generating a simulated voltage contrast image includes steps for receiving as input design information for an integrated circuit die, selecting a test condition for the integrated circuit die, selecting an area and a layer of the integrated circuit die to display in a simulated voltage contrast image, generating an image of a selected net in the selected area and layer of the integrated circuit die from the design information, generating a trace outline of the selected net from the image, analyzing the design information to calculate an interaction between a charged particle beam and the selected net for the selected test condition, mapping the calculated interaction for the selected net to a shading, and filling the trace outline of the selected net with the shading to generate a simulated voltage contrast image for the selected test condition.

FIG. 10 illustrates a flow chart 1000 of a method of generating a simulated voltage contrast image for an integrated circuit according to an embodiment of the present invention.

Step 1002 is the entry point of the flow chart 1000.

In step 1004, the design information for a selected integrated circuit die is received as input. For example, the design information may include a GDS2 file for the design layout and a SPICE netlist to assist in the circuit analysis.

In step 1006, a test condition is selected for the integrated circuit die. For example, the test condition may include bridging or cutting nets. The selected test condition may be entered according to well known techniques using standard integrated circuit design software tools.

In step 1008, an area and layer of the integrated circuit die is selected for generating a simulated voltage contrast image.

In step 1010, an image of a selected net in the selected area and layer of the integrated circuit die is generated according to well known CAD techniques.

In step 1012, a trace outline of the selected net is generated from the image. The selected net may also include any other feature of interest in the circuit design, such as contact pads and vias. The trace outline may be performed manually by literally tracing the net outline from a display of the CAD image, or the trace outline may be performed automatically, for example, by extracting the net outline information from the CAD image file.

In step 1014, the circuit design is analyzed according to well known techniques to calculate the interaction between a charged particle beam and the selected net for the selected test condition. The interaction is typically expressed as a number of charged particles scattered from the selected net.

In step 1016, the calculated interaction for each selected net is mapped to a shading that is matched to the interaction between the charged particle beam and the selected net in an actual voltage contrast image. The shading may be mapped to a gray scale to match the test equipment and test equipment settings, or the shading may be mapped to a color scale, for example, to facilitate visual comparisons of the die under various selected test conditions. For example, the gray scale shading may be white to indicate a ground potential and dark to indicate a floating potential.

In step 1018, each selected net is filled with the shading to indicate the interaction between the charged particle beam and the selected net to generate the simulated voltage contrast image for the selected test condition.

In step 1020, the simulated voltage contrast image is compared to the actual voltage contrast image to detect any anomaly between the calculated interaction and the actual interaction between the charged particle beam and the selected net for the selected test condition.

In step 1022, if an anomaly is detected from the comparison of the simulated voltage contrast image to the actual voltage contrast image, the next layer in the design of the integrated circuit die is selected and control is transferred back to step 1008 until the cause of the anomaly is found.

Step 1024 is the exit point of the flow chart 1000.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

In a further aspect of the present invention, the methods illustrated in the flowchart descriptions above may be embodied in a computer program product and implemented by instructions for a computer according to well known programming techniques to perform the following functions:

(a) receiving as input design information for an integrated circuit die;

(b) selecting a net of the integrated circuit from the design information;

(c) generating a trace outline of the selected net from the image;

(d) analyzing the design information to calculate an interaction between a charged particle beam and the selected net;

(e) selecting a shading representative of the calculated interaction; and (f) filling the trace outline of the selected net with the shading to generate the simulated voltage contrast image.

While the invention herein disclosed has been described by means of specific embodiments and applications thereof, numerous modifications and variations could be made thereto by those skilled in the art without departing from the scope of the invention set forth in the following claims.

What is claimed is:

1. A method of generating a simulated voltage contrast image comprising steps for:

(a) receiving as input design information for an integrated circuit die;

(b) selecting a net of the integrated circuit from the design information;

(c) generating a trace outline of the selected net from the image;

(d) analyzing the design information to calculate an interaction between a charged particle beam and the selected net;

(e) selecting a shading representative of the calculated interaction; and (f) filling the trace outline of the selected net with the shading to generate the simulated voltage contrast image.

2. The method of claim 1 further comprising a step for selecting a test condition by modifying the design information.

3. The method of claim 2 wherein modifying the design information is representative of one of bridging and cutting the selected net in the integrated circuit die.

4. The method of claim 1 further comprising a step for comparing the simulated voltage contrast image to an actual voltage contrast image.

5. The method of claim 4 further comprising a step after the step (f) for selecting another layer of the integrated circuit die and transferring control back to the step (d).

6. The method of claim 1 wherein the calculated interaction between the charged particle beam and the selected net comprises a number of charged particles received by a detector from the selected net.

7. The method of claim 1 wherein the design information includes a GDS2 file.

8. The method of claim 1 wherein the design information includes a SPICE netlist.

9. The method of claim 1 wherein the shading includes a color.

10. The method of claim 1 wherein the shading includes a gray scale.

11. A computer program product for generating a simulated voltage contrast image comprising:
   a medium for embodying a computer program for input to a computer; and
   a computer program embodied in the medium for causing the computer to perform the following functions:
   (a) receiving as input design information for an integrated circuit die;
   (b) selecting a net of the integrated circuit from the design information;
   (c) generating a trace outline of the selected net from the image;
   (d) analyzing the design information to calculate an interaction between a charged particle beam and the selected net;
   (e) selecting a shading representative of the calculated interaction; and
   (f) filling the trace outline of the selected net with the shading to generate the simulated voltage contrast image.

12. The computer program product of claim 11 wherein the functions further comprise selecting a test condition comprises by modifying the design information.

13. The computer program product of claim 12 wherein modifying the design information is representative of one of bridging and cutting the selected net in the integrated circuit die.

14. The computer program product of claim 11 wherein the functions further comprise comparing the simulated voltage contrast image to an actual voltage contrast image.

15. The computer program product of claim 14 wherein the functions further comprise selecting another layer of the integrated circuit die and transferring control back to (d).

16. The computer program product of claim 11 wherein the calculated interaction between the charged particle beam and the selected net comprises a number of charged particles received by a detector from the selected net.

17. The computer program product of claim 11 wherein the design information includes a GDS2 file.

18. The computer program product of claim 11 wherein the design information includes a SPICE netlist.

19. The computer program product of claim 11 wherein the shading includes color.

20. The computer program product of claim 11 wherein the shading includes a gray scale.

21. A method of generating a simulated voltage contrast image comprising:
   (a) receiving as input design information for an integrated circuit die;
   (b) selecting a test condition for the integrated circuit die;
   (c) selecting an area and a layer of the integrated circuit die to display in a simulated voltage contrast image;
   (d) generating an image of a selected net in the selected area and layer of the integrated circuit die from the design information;
   (e) generating a trace outline of the selected net from the image;
   (f) analyzing the design information to calculate an interaction between a charged particle beam and the selected net for the selected test condition;
   (g) mapping the calculated interaction for the selected net to a shading; and
   (h) filling the trace outline of the selected net with the shading to generate the simulated voltage contrast image for the selected test condition.

* * * * *